US012178082B2

(12) United States Patent
Chen et al.

(10) Patent No.: US 12,178,082 B2
(45) Date of Patent: Dec. 24, 2024

(54) ORGANIC LIGHT EMITTING DIODE DISPLAY SUBSTRATE COMPRISING A FIRST CAPACITOR PLATE, A SECOND CAPACITOR PLATE AND A DATA LINE SEQUENTIALLY DISPOSED FROM A BASE SUBSTRATE, MANUFACTURING METHOD THEREOF, AND DISPLAY DEVICE COMPRISING THE SAME

(71) Applicant: BOE Technology Group Co., Ltd., Beijing (CN)

(72) Inventors: Yipeng Chen, Beijing (CN); Li Wang, Beijing (CN); Lujiang Huangfu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/372,884

(22) Filed: Sep. 26, 2023

(65) Prior Publication Data

US 2024/0023375 A1     Jan. 18, 2024

Related U.S. Application Data

(63) Continuation of application No. 17/366,704, filed on Jul. 2, 2021, now Pat. No. 11,805,682, which is a
(Continued)

(30) Foreign Application Priority Data

Jan. 14, 2019 (CN) .......................... 201910032958.1

(51) Int. Cl.
*H01L 29/08* (2006.01)
*G09G 3/3291* (2016.01)
(Continued)

(52) U.S. Cl.
CPC ....... *H10K 59/1216* (2023.02); *G09G 3/3291* (2013.01); *H10K 59/1213* (2023.02); *H10K 59/126* (2023.02)

(58) Field of Classification Search
CPC ........... H10K 59/1216; H10K 59/1213; H10K 59/126; G09G 3/3291
(Continued)

(56) References Cited

U.S. PATENT DOCUMENTS

2011/0171760 A1* 7/2011 Ji ...................... H01L 21/76838
257/E21.294

FOREIGN PATENT DOCUMENTS

KR     20150100462 A   *   9/2015   ......... H10K 59/126
KR     20160068635 A   *   6/2016   ......... H10K 59/126

* cited by examiner

*Primary Examiner* — Phuc T Dang
(74) *Attorney, Agent, or Firm* — Lippes Mathias LLP

(57) ABSTRACT

An organic light emitting diode display substrate, comprises: a base substrate, and a first data line, a driving thin film transistor and an energy storage capacitor, wherein the energy storage capacitor comprises a first capacitor plate and a second capacitor plate disposed opposite to each other, and the second capacitor plate is electrically connected to a gate of the driving thin film transistor, in a direction away from the base substrate, the first capacitor plate is disposed between the first data line and the second capacitor plate. The display substrate further comprises a shielding portion. The shielding portion is between the second capacitor plate and the first data line in a direction perpendicular to the base substrate, and an orthographic projection of the shielding portion on the base substrate at least partially overlap an orthographic projection of the first data line on the base substrate.

20 Claims, 12 Drawing Sheets

Related U.S. Application Data continuation of application No. 16/736,893, filed on Jan. 8, 2020, now Pat. No. 11,056,553.

(51) Int. Cl.
*H10K 59/121* (2023.01)
*H10K 59/126* (2023.01)

(58) Field of Classification Search
USPC .......................................................... 257/40
See application file for complete search history.

ORGANIC LIGHT EMITTING DIODE DISPLAY SUBSTRATE COMPRISING A FIRST CAPACITOR PLATE, A SECOND CAPACITOR PLATE AND A DATA LINE SEQUENTIALLY DISPOSED FROM A BASE SUBSTRATE, MANUFACTURING METHOD THEREOF, AND DISPLAY DEVICE COMPRISING THE SAME

This application is a continuation application based on U.S. application Ser. No. 17/366,704, now U.S. Pat. No. 11,805,682, filed on Jul. 2, 2021, which is a continuation application based on U.S. application Ser. No. 16/736,893, now U.S. Pat. No. 11,056,553, filed on Jan. 8, 2020, which claims priority to Chinese Patent Application No. 201910032958.1, filed on Jan. 14, 2019 and entitled "ORGANIC LIGHT EMITTING DIODE DISPLAY SUBSTRATE, MANUFACTURING METHOD THEREOF, AND DISPLAY DEVICE", the entire contents of which are incorporated herein by reference.

TECHNICAL FIELD

Embodiments of the present disclosure relate to an organic light emitting diode display substrate, a manufacturing method thereof, and a display device comprising the display substrate.

BACKGROUND

Organic Light-Emitting Diode (OLED) displays are mainstream displays with a wide range of applications, and they have the advantages of being ultra-thin and light, low production costs and etc.

A display panel of an OLED display generally comprises an array substrate and a cover plate disposed opposite to each other, and a light emitting unit disposed on the array substrate. The array substrate comprises a base substrate and a plurality of data lines and a plurality of scan lines disposed on the base substrate. The plurality of data lines and the plurality of scan lines cross each other to define a plurality of pixel regions. Each pixel region is provided at least with one driving TFT (Thin Film Transistor), one switching TFT, and one energy storage capacitor. A source of the switching TFT is connected to the data line, a gate of the switching TFT is connected to the scan line, and a drain of the switching TFT is connected to one capacitor plate of the energy storage capacitor. The other capacitor plate of the energy storage capacitor is integrated with a gate of the driving TFT. A source of the driving TFT is connected to a power signal line, and a drain of the driving TFT is connected to the light emitting unit.

When the gray level of the pixel changes, a voltage on the data line changes. Parasite capacitance is formed between the data line and the capacitor plate integrated with the gate of the driving TFT. Due to the influence of the parasite capacitance, the voltage on the capacitor plate will be caused to change when the voltage on the data line changes, which leads to change in the voltage on the gate of the driving TFT, thereby causing abnormality in the gray level of the pixel and abnormality of the displayed image.

SUMMARY

At least one embodiment of the present disclosure provides an organic light emitting diode display substrate, comprising a base substrate, a first data line, a driving thin film transistor, and an energy storage capacitor, wherein the first data line, the driving thin film transistor and the energy storage capacitor are disposed on the base substrate; the energy storage capacitor comprises a first capacitor plate and a second capacitor plate disposed opposite to each other, the second capacitor plate is disposed on the base substrate, the first capacitor plate is disposed on a side of the second capacitor plate away from the second capacitor plate, the first data line is disposed on a side of the first capacitor plate away from the base substrate, and the second capacitor plate is electrically connected to a gate of the driving thin film transistor; wherein the organic light emitting diode display substrate further comprises a first shielding portion which is disposed at least partially between the second capacitor plate and the first data line.

At least one Embodiment of the present disclosure provides an organic light emitting diode display device, which comprises the display substrate as described above.

At least one embodiment of the present disclosure provides a method of manufacturing an organic light emitting diode display substrate, comprising: preparing a base substrate, and forming a driving thin film transistor, an energy storage capacitor and a first data line on the base substrate, the energy storage capacitor comprising a first capacitor plate and a second capacitor plate, wherein, the second capacitor plate, the capacitor plate and the first data line are sequentially formed on the base substrate, and the first capacitor plate and the second capacitor plate are disposed opposite to each other, wherein the second capacitor plate is electrically connected to a gate of the driving thin film transistor, and the method further comprising: forming a first shielding portion, wherein the first shielding portion is disposed at least partially between the second capacitor plate and the first data line.

BRIEF DESCRIPTION OF THE DRAWINGS

In order to describe the technical solutions in the embodiments of the present more clearly, the following briefly introduces the accompanying drawings required for describing the embodiments. Apparently, the accompanying drawings in the following description show merely some embodiments of the present disclosure, and a person of ordinary skill in the art may also derive other drawings from these accompanying drawings without creative efforts.

DETAILED DESCRIPTION

The present disclosure will be described in further detail with reference to the accompanying drawings, to present the objects, technical solutions, and advantages of the present disclosure more clearly.

At least one embodiment of the present disclosure provides a display substrate comprising a base substrate, and a first data line, a driving thin film transistor and an energy storage capacitor which are disposed on the base substrate. The energy storage capacitor comprises a first capacitor plate and a second capacitor plate disposed opposite to each other, the second capacitor is disposed on the base substrate, the first capacitor plate is disposed on a side of the second capacitor plate away from the base substrate, the first data line is disposed on a side of the first capacitor plate away from the base substrate, and the second capacitor plate is electrically connected to a gate of the driving thin film transistor, wherein the display substrate further comprises a first shielding portion, which is disposed at least partially between the second capacitor plate and the first data line.

In some embodiments of the present disclosure, the first shielding portion is electrically connected to the first capacitor plate.

In some embodiments of the present disclosure, the gate of the driving thin film transistor and the second capacitor plate can be formed into an integrated structure, that is, the second capacitor plate is used as both an electrode plate of the energy storage capacitor and the gate of the driving thin film transistor.

In the embodiments of the present disclosure, the first shielding portion is disposed at least partially between the second capacitor plate and the first data line, and can shield the capacitive coupling between the second capacitor plate and the first data line, thereby reducing the parasitic capacitance between the second capacitor plate and the first data line, and reducing the effect on the voltage of the second capacitor plate by the change in voltage on the first data line, that is, reducing the voltage change of the gate of the thin film transistor. Thus, the influence on the displayed image caused by changes between different gray levels is effectively improved.

Figure 1:
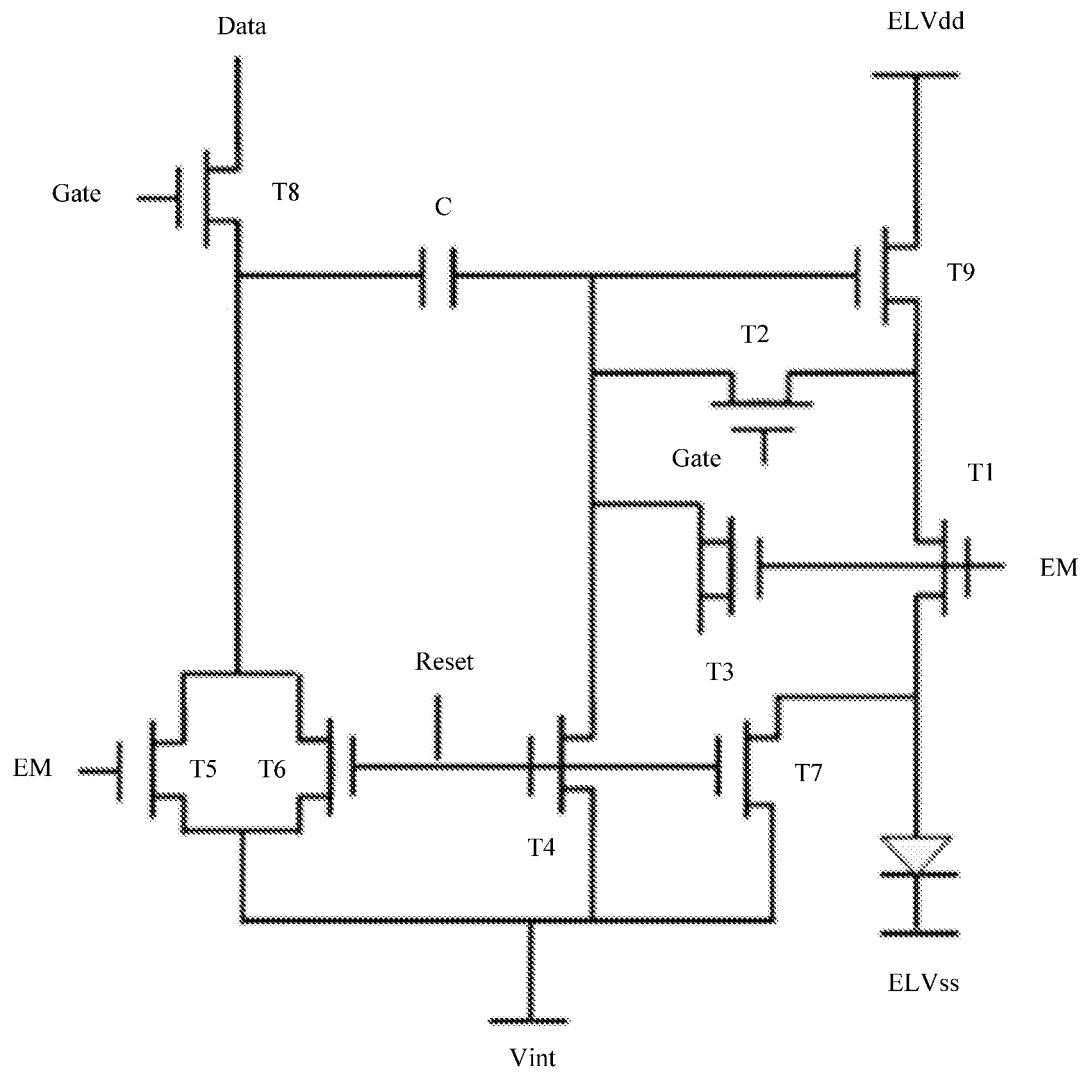
FIG. 1 is a schematic diagram of a pixel driving circuit.

Generally, the display substrate comprises a plurality of data lines and a plurality of scan lines, wherein the plurality of data lines and the plurality of scan lines cross each other to define a plurality of pixel units arranged in an array. Each pixel unit has a pixel driving circuit. The embodiments of the present disclosure do not limit the structure of the pixel driving circuit, as long as the pixel driving circuit comprises a driving thin film transistor and an energy storage capacitor. The 9T1C pixel driving circuit as illustrated in FIG. 1 is taken as an example for illustration. The pixel driving circuit is a pixel driving circuit for an active matrix organic light emitting diode (AMOLED) display.

FIG. 1 is a schematic diagram of a pixel driving circuit. As illustrated in FIG. 1, the pixel driving circuit comprises a switching thin film transistor T8, an energy storage capacitor C, a driving thin film transistor T9, a first thin film transistor T1, a second thin film transistor T2, a third thin film transistor T3, a fourth thin film transistor T4, a fifth thin film transistors T5, a sixth thin film transistor T6, and a seventh thin film transistor T7.

The first electrode of the switching thin film transistor T8 is connected to the data line and receives a data signal Data. The gate of the switching thin film transistor T8 is connected to the scan line and receives a gate signal Gate. The second electrode of the switching thin film transistor T8 is connected to the first capacitor plate of the energy storage capacitor C. The second capacitor plate of the energy storage capacitor C is connected to the gate of the driving thin film transistor T9. The first electrode of the driving thin film transistor 9 is connected to a power line and receive a power signal ELVdd, and the second electrode of the driving thin film transistor T9 is connected to the first electrode of the first thin film transistor T1. The second electrode of the first thin film transistor T1 is connected to an anode of the organic light emitting diode, and the gate of the first thin film transistor T1 is connected to a control line for light emitting, and receives a control signal for light emitting EM.

The second capacitor plate of the energy storage capacitor C is further connected to the first electrode of the second thin film transistor T2. The second electrode of the second thin film transistor T2 is connected to the second electrode of the driving thin film transistor T9, and the gate of the second thin film transistor T2 is connected to the scan line and receives a gate signal Gate.

The second capacitor plate of the energy storage capacitor C is further connected to the first electrode of the third thin film transistor T3. The second electrode of the third thin film transistor T3 is floating, and the gate of the third thin film transistor T3 is connected to the control line for light emitting and receives the control signal for light emitting EM.

The second capacitor plate of the energy storage capacitor C is further connected to the first electrode of the fourth thin film transistor T4. The second electrode of the fourth thin film transistor T4 is connected to a reference signal line and receives a reference signal Vint. The gate of the fourth thin film transistor T4 is connected to a reset signal line and receives a reset signal Reset.

The second electrode of the switching thin film transistor T8 is connected to both the first electrode of the fifth thin film transistor T5 and the first electrode of the sixth thin film transistor T6. Both the second electrode of the fifth thin film transistor T5 and the second electrode of the sixth thin film transistor T6 are connected to the reference signal line and receive the reference signal Vint. The gate of the fifth thin film transistor T5 is connected to the control line for light emitting and receives the control signal for light emitting EM, and the gate of the sixth thin film transistor T6 is connected to the reset signal line and receives a reset signal Reset.

The first electrode of the seventh thin film transistor T7 is connected to the second electrode of the first thin film transistor T1, the second electrode of the seventh thin film transistor T7 is connected to the reference signal line and receives the reference signal Vint, and the gate of the seventh thin film transistor T7 is connected to the reset signal line and receives the reset signal Reset.

The first electrode of the thin film transistor can be a source or a drain, and the second electrode of the thin film transistor can be a drain or a source.

Figure 2:
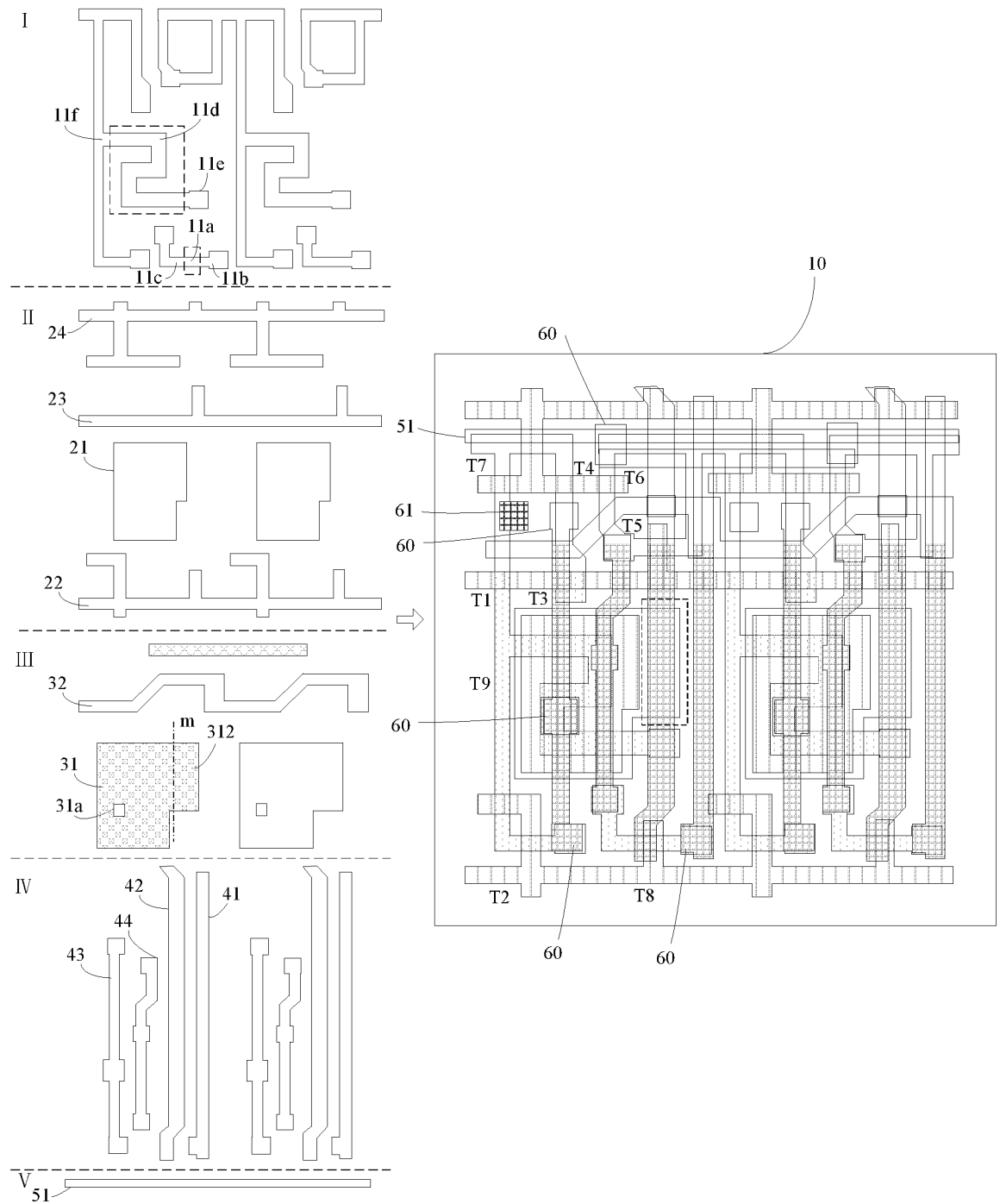
FIG. 2 is a schematic diagram of a partial structure of a display substrate according to an embodiment of the present disclosure.

FIG. 2 is a schematic diagram of a partial structure of a display substrate according to an embodiment of the present disclosure. As illustrated in FIG. 2, the display substrate can comprise a base substrate 10, five pattern layers, and an insulating layer between adjacent pattern layers. The five pattern layers can comprise a first pattern layer I, a second pattern layer II, a third pattern layer III, a fourth pattern layer IV, and a fifth pattern layer V, which are sequentially laminated on the base substrate 10.

The first pattern layer I can comprise an active layer and a source and a drain of a thin film transistor. FIG. 2 schematically illustrates an active layer 11a, a source 11b, and a drain 11c of the switching thin film transistor T8 and an active layer 11d, a source 11e, and a drain 11f of the driving thin film transistor T9. The active layer can be made of at least one of InGaZnO, InGaO, ITZO, and AlZnO. The source and drain can be made of a material which is the same as that of the active layer and has been subject to metallization, or made of a metal material.

The second pattern layer II can comprise a second capacitor plate 21, a scan line 22, a control line for light emitting 23, and a reset signal line 24. A gate of the driving thin film transistor T9 is electrically connected to the second capacitor plate 21, or the driving thin film transistor T9 and the second capacitor plate 21 are an integrated structure. Herein, the integrated structure can mean that the gate of the driving thin film transistor T9 and the second capacitor plate 21 can be the same structure, that is, the second capacitor plate 21 is used as both an electrode plate of the energy storage capacitor C and the gate of the driving thin film transistorT9. The integrated structure can further mean that the gate of the driving thin film transistor T9 and the second capacitor plate 21 are different structures that are electrically connected to each other.

The third pattern layer III can comprise a first capacitor plate 31.

The fourth pattern layer IV can include a first data line 41, a power line 42, a first connecting line 43, and a second connecting line 44. The first connecting line 43 can be configured to be connected to the second capacitor plate 21, the first electrode of the second thin film transistor T2, the first electrode of the third thin film transistor T3, and the first electrode of the fourth thin film transistor T4. The second connecting line 44 can be configured to be connected to the second electrode of the switching thin film transistor T8, the first capacitor plate 31, the first electrode of the fifth thin film transistor T5, and the first electrode of the sixth thin film transistor T6. The orthographic projections of the first data line 41 and the power line 42 on the base substrate 10 are located in a gap between the orthographic projections of adjacent second capacitor plates 21 on the base substrate 10.

The fifth pattern layer V can comprise a reference signal line 51. The second pattern layer II, the third pattern layer III, the fourth pattern layer IV, and the fifth pattern layer V can be all made of a metal material, such as copper.

Structures on different pattern layers to be connected can be connected through via holes. Some of the via holes 60 are illustrated in FIG. 2. For example, the first data line 41 is connected to the source 11b of the switching thin film transistor T8, the first data line 41 is located in the fourth pattern layer IV, and the source 11b of the switching thin film transistor T8 is located in the first pattern layer I. The first data line 41 and the source 11b of the switching thin film transistor T8 can be connected through the via hole 60. The power line 42 and the source 11e of the driving thin film transistor T9 can be connected through the via hole 60. The reference signal line 51 is connected to the second electrode of the fourth thin film transistor T4, the second electrode of the fifth thin film transistor T5, the second electrode of the sixth thin film transistor T6, and the second electrode of the seventh thin film transistor T, through a via hole 60. The via hole 61 is used for connecting to the anode of the organic light emitting diode.

The first electrode of the second thin film transistor T2, the first electrode of the third thin film transistor T3, and the first electrode of the fourth thin film transistor T4 are all connected to the second capacitor plate 21. By providing the first connecting line 43, the first electrode of the second thin film transistor T2, the first electrode of the third thin film transistor T3, the first electrode of the fourth thin film transistor T4, and the second capacitor plate 21 can be all connected to the first connecting line 43, so as to achieve the required connection manners. As illustrated in FIG. 2, the first capacitor plate 31 can have an opening 31a, and a via hole 60 connecting the second capacitor plate 21 and the first connecting line 43 can be provided at the opening 31a.

The second connecting line 44 can be configured to be connected to the second electrode of the switching thin film transistor T8, the first capacitor plate 31, the first electrode of the fifth thin film transistor T5, and the first electrode of the sixth thin film transistor T6. The second electrode of the switching thin film transistor T8, the first capacitor plate 31, the first electrode of the fifth thin film transistor T5, and the first electrode of the sixth thin film transistor T6 can be all connected to the second connecting line 44 through the via hole 60.

As illustrated in FIG. 2, the display substrate can further comprise a voltage equalizing line 32. Multiple power lines 42 are connected to the voltage equalizing line 32, so that the voltages of all the power lines 42 can be equal to each other, and the total resistance of the power lines 42 can be reduced. In the embodiment illustrated in FIG. 2, the voltage equalizing lines 32 are disposed in the third pattern layer III, that is, the voltage equalizing lines 32 are disposed on the same layer as the first capacitor plate 31. The term "disposed on/in the same layer" here refers to being disposed on the same side of the same layer, or being formed by a single patterning process, or the surfaces close to the base substrate 10 are in contact with the same layer. For example, the voltage equalizing lines 32 being disposed on the same layer as the reference signal line 51 can mean that the voltage equalizing lines 32 and the reference signal line 51 are disposed on the same side of the second pattern layer II, or, can mean that the voltage equalizing lines 32 and the reference signal line 51 are formed through a single patterning process, or, can meant that the respective surface of the voltage equalizing lines 32 and the reference signal line 51 close to the base substrate 10 are all in contact with the second pattern layer II. In other embodiments, the fifth pattern layer V can further comprise a voltage equalizing line 32, that is, the voltage equalizing line 32 and the reference signal line 51 are disposed in the same layer. Regardless of which layer the voltage equalizing line is disposed in, the voltage equalizing line 32 and the power line 42 can be connected through the via hole 60.

FIG. 2 illustrates two energy storage capacitors respectively located in two adjacent pixel units. The orthographic projection of the first data line 41 on the base substrate 10 is located between the second capacitor plates 21 of the two adjacent energy storage capacitors. A parasitic capacitance is formed between the first data line 41 and the respective second capacitor plates 21. As illustrated in FIG. 2, the first capacitor plate 31 and the second capacitor plate 21 are disposed opposite to each other. FIG. 2 illustrates a schematic diagram after the pattern layers are laminated. As illustrated in the dashed block in FIG. 2, the first shielding portion 312 is electrically connected to the first capacitor plate 31 and is disposed at least partially between the second capacitor plate 21 and the first data line 41. The first shielding portion 312 illustrated in FIG. 2 can shield the capacitive coupling between the first data line 41 and the second capacitive plate 21, reducing the parasite capacitance between the second capacitive plate 21 and the first data line 41.

In some embodiments of the present disclosure, the first shielding portion 312 can extend from the first capacitor plate 31 and extend to be disposed at least partially between the second capacitor plate 21 and the first data line 41 which is disposed adjacent to the second capacitor plate 21. In some embodiments of the present disclosure, the first shielding portion 312 can be integrated with the first capacitor plate 31 and is disposed at least partially between the second capacitor plate 21 and the first data line 41.

Figure 3:
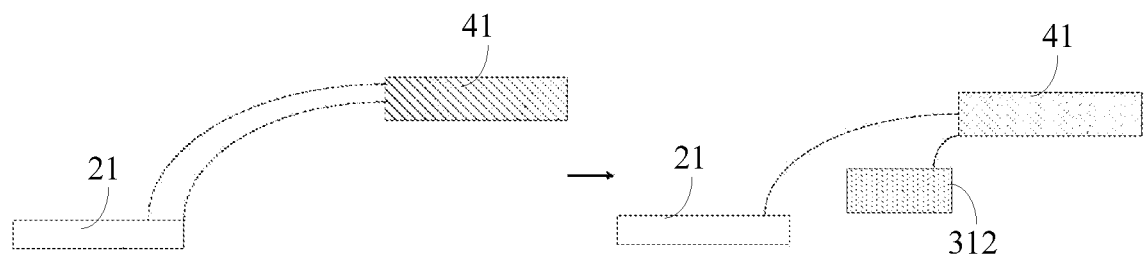
FIG. 3 is a diagram illustrating a shielding principle of a first shielding portion.

FIG. 3 is a schematic diagram of a shielding principle of the first shielding portion. The dashed lines in FIG. 3 represents the electric field. As illustrated in FIG. 3, if no first shielding portion 312 is disposed between the second capacitor plate 21 and the first data line 41, a relatively great capacitive coupling presents between the second capacitor plate 21 and the first data line 41, and the smaller the distance between the second capacitor plate 21 and the first data line 41 is, the greater the capacitive coupling is. Due to the limited space in the display substrate, the distance between the second capacitor plate 21 and the first data line 41 cannot be large enough to effectively weaken the capacitive coupling. When the position of the second capacitor plate 21 with respect to the first data line 41 remains unchanged, if a first shielding portion 312 is disposed therebetween, the capacitive coupling effect can be effectively shielded. Due to the parasitic capacitance between the second capacitor plate 21 and the first data line 41, the change in voltage on the first data line will affect the voltage of the second capacitor plate 21, that is, the voltage that drives the gate of the driving thin film transistor T9. When the first shielding portion 312 is disposed between the second capacitor plate 21 and the first data line 41 so that the parasite capacitance between the second capacitor plate 21 and the first data line 41 decreases significantly, the influence of the change in voltage on the first data line on the voltage of the gate of the driving thin film transistor T9 is reduced.

The technical solution according to the embodiments of the present disclosure has the following beneficial effect: by providing the first capacitor plate, the second capacitor plate, and the first data line, in the direction away from the base substrate, the first capacitor plate is disposed between the first data line and the second capacitor plate. The display substrate further comprises a first shielding portion, and the first shielding portion is disposed at least partially between the first data line and the second capacitor plate, and can shield the capacitive coupling between the second capacitive plate and the first data line, thereby reducing the parasitic capacitance between the second capacitive plate and the first data line, and lowering the influence of the change in voltage on the first data line on the voltage on the second capacitor plate, that is, reducing the voltage change of the gate of the thin film transistor. Thus, the influence on the displayed image caused by changes between different gray levels is effectively improved.

Figure 4:
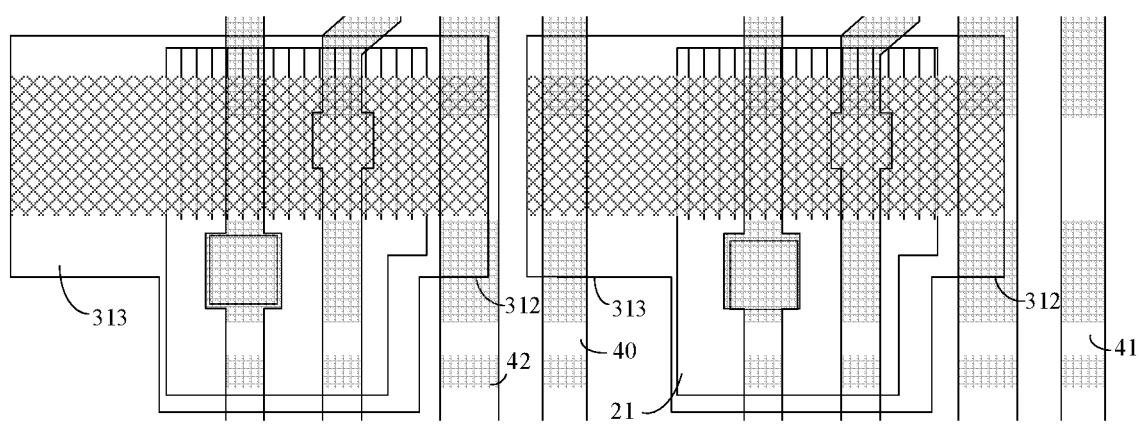
FIG. 4 is a schematic diagram of a partial structure of a display substrate according to an embodiment of the present disclosure.

FIG. 4 is a schematic diagram of a partial structure of a display substrate according to an embodiment of the present disclosure. Compared to the display substrate as illustrated in FIG. 2, as illustrated in FIG. 4, the display substrate can further comprise a second shielding portion 313 and a second data line 40. The second shielding portion 313 is disposed at least partially between the second capacitor plate 21 and the second data line 40. The second data line 40 is disposed on a same layer as the first data line 41, and is disposed on a side of the second capacitor plate 21 away from the first data line 41, and the second shielding portion is disposed on an opposite side of the first capacitor plate with respect to the first shielding portion. Since each second capacitor plate 21 has two adjacent data lines, namely, the first data line 41 and the second data line 40, a parasitic capacitance is formed between each second capacitor plate 21 and the first data line 41 and between each second capacitor plate 21 and the second data line 40. Taking the first capacitor plate 31 at the right side of FIG. 4 as an example, the first shielding portion 312 can shield the capacitive coupling between the first data line 41 and the second capacitor plate 21, thereby reducing the parasite capacitance between first data line 41 and the second capacitor plate 21, and the second shielding portion 313 can shield the capacitive coupling between the second data line 40 and the second capacitor plate 21, thereby reducing the parasite capacitance between the second data line 40 and the second capacitor plate 21. Thus, by providing the first shielding portion 312 and the second shielding portion 313, the parasite capacitance between the two data lines and the second capacitor plate can be reduced, which facilitates further improvement in the quality of displayed image. The shielding principle of the second shielding portion is same as the shielding principle of the first shielding portion, and will not be elaborated herein.

In some embodiments of the present disclosure, the second shielding portion is electrically connected to the first capacitor plate. In some embodiments of the present disclosure, the second shielding portion 313 can extend from the first capacitor plate 31, and is disposed at least partially between the second capacitor plate 21 and the second data line 40. In some embodiments of the present disclosure, the second shielding portion 312 can be integrated with the first capacitor plate 31 and is disposed at least partially between the second capacitor plate 21 and the second data line 40.

Figure 5:
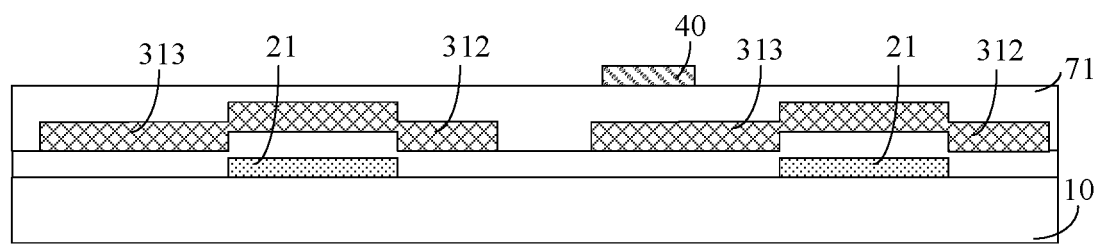
FIG. 5 is a partial cross-section view of a display substrate according to an embodiment of the present disclosure.

In embodiments of the present disclosure where the first shielding portion extends from the first capacitor plate, or the first shielding portion is integrated with the first capacitor plate, the first capacitor plate and the first shielding portion may not be coplanar. FIG. 5 is a partial cross-section view of a display substrate according to an embodiment of the present disclosure. As illustrated in FIG. 5, the first capacitor plate 31 and the first shielding portion 312 are not coplanar. After the second pattern layer II is formed, when an insulating layer 71 is formed on the second pattern layer II, the surface of the formed insulating layer 71 is not flat due to the influence of the second capacitor plate 21. So, even though the first capacitor plate 31 and the first shielding portion 312 have the same thickness, the distance from the first capacitor plate 31 to the base substrate 10 is also greater than the distance from the first shielding portion 312 to the base substrate 10. Similarly, in the case where the display substrate further comprises a second shielding portion 313 and the second shielding portion 313 extends from the first capacitor plate, or the second shielding portion 313 is integrated with the first capacitor plate, the second shielding portion313 and the first capacitor plate are also not coplanar.

In some embodiments of the present disclosure, the first capacitor plate 31 and the first shielding portion 312 may also be coplanar. The second shielding portion 313 and the first capacitor plate 31 may also be coplanar. By providing the surface of the insulating layer 71 on the second pattern layer II as a flat structure, the first capacitor plate 31 and the first shielding portion 312 and/or the second shielding portion 313 can be formed in the same plane.

As illustrated in FIG. 5, the orthographic projection of the second data line 40 can beat least partially within the orthographic projection of the first capacitor plate 31 that is adjacent to the second date line 41 on the base substrate 10. Thus, the second shielding portion 313 can shield the capacitive coupling between the second data line 40 and the second capacitive plate 21 better, which facilitates reduction of the parasite capacitance between the second capacitive plate 21 and the second data line 40. For example, in the display substrate illustrated in FIG. 5, the second shielding portion 313 extends directly below the second data line 40.

In some embodiments of the present disclosure, only one of the first shielding portion 312 and the second shielding portion 313 may be disposed in the display substrate. In some embodiments of the present disclosure, both the first shielding portion 312 and the second shielding portion 313 may be disposed in the display substrate. In some embodiments of the present disclosure, a first shielding portion is connected to the first capacitor plate in some energy storage capacitors of the display substrate, and a second shielding portion is connected to a first capacitor plate in some energy storage capacitors, and both the first shielding portion and the second shielding portion are connected to the first capacitor plate of the remaining energy storage capacitors.

In some embodiments of the present disclosure, the display substrate may further comprise a third shielding portion which extends parallel to the first data line 41, and disposed between adjacent first capacitor plates. The third shielding portion is disposed between the first data line or the second data line and the second capacitor plate. Herein, the third shielding portion being disposed between the first data line or the second data line and the second capacitor plate means that at least portion of the third shielding portion is located on a line connecting the first data line or the second data line and the second capacitor plate.

Figure 6:
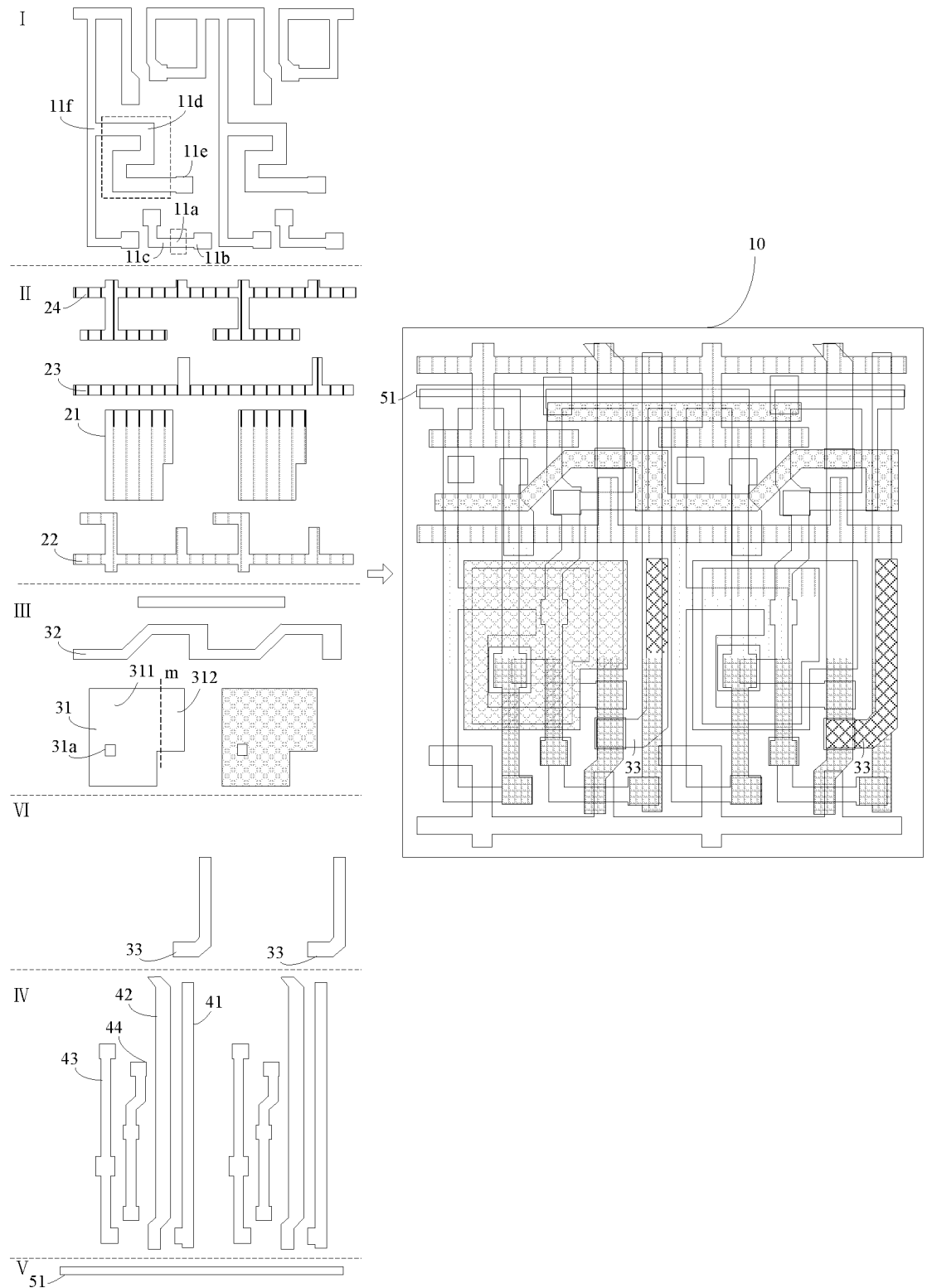
FIG. 6 is a schematic structural diagram of an organic light emitting diode display substrate according to an embodiment of the present disclosure.

FIG. 6 is a schematic structural diagram of a display substrate according to another embodiment of the present disclosure. As illustrated in FIG. 6, the display substrate can comprise a base substrate 10, six pattern layers, and respective insulating layers between adjacent pattern layers. The six pattern layers can comprise a first pattern layer I, a second pattern layer II, a third pattern layer III, a sixth pattern layer VI, a fourth pattern layer IV, and a fifth pattern layer V, which are sequentially laminated on the base substrate 10. The first pattern layer I, the second pattern layer II, the third pattern layer III, the fourth pattern layer IV, and the fifth pattern layer V as illustrated in FIG. 6 are same as the first pattern layer I, the second pattern layer II, the third pattern layer III, the fourth pattern layer IV, and the fifth pattern layer V as illustrated in FIG. 2, and will not be elaborated herein. The sixth pattern layer VI can comprise the third shielding portion 33.

Figure 7:
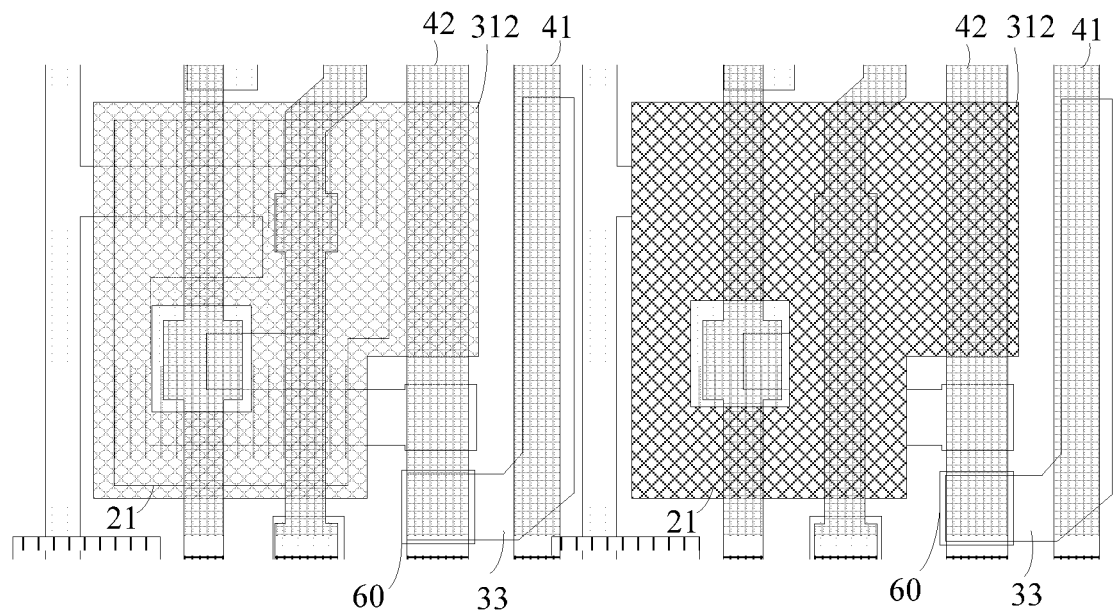
FIG. 7 is a partially enlarged schematic diagram of FIG. 6.

FIG. 7 is a partially enlarged schematic diagram of FIG. 6. As illustrated in FIG. 7, the third shielding portion 33 extends parallel to the first data line, and is disposed between adjacent first capacitor plates 31. The third shielding portion 33 is disposed between the first data line 41 and the second capacitor plate 21. By providing a third shielding portion 33 additionally to separate the first data line 41 and the second capacitor plate 21, the capacitive coupling between the second capacitor plate 21 and the first data line 41 adjacent to the second capacitor plate 21 can also be shielded, which helps mitigate the abnormality of displayed image. The shielding principle of the third shielding portion 33 is the same as the shielding principle of the first shielding portion 312. The latter has been described with reference to FIG. 3, and details will not be repeated herein again.

As illustrated in FIG. 7, the orthographic projection of the data line 41 on the base substrate 10 can at least partially overlap the orthographic projection of the third shielding portion 33 on the base substrate 10, to improve the shielding effect.

In the display substrate illustrated in FIGS. 6 and 7, the third shielding portion 33 is arranged in a different layer from the first capacitor plate 31 and the first shielding portion 312. The third shielding portion 33 is disposed in a different layer from the first capacitor plate 31 and the first shielding portion. The third shielding portion 33 can manufactured separately by adding a patterning process and the patterning processes for other layers does not change. Thus, minor changes are made to the processes. In addition, the added patterning process is used to manufacture the third shielding portion 33 only, the accuracy requirement for the patterning process is low, which is helpful to reduce the difficulty of the patterning process.

In some embodiments of the present disclosure, the third shielding portion 33 can be disposed in the same layer as the first capacitor plate 31 and the first shielding portion 312. For example, the third pattern layer III can further comprise the third shielding portion 33. By disposing the third shielding portion 33 in the same layer as the first capacitor plate 31 and the first shielding portion 312, the third shielding portion 33, the first capacitor plate 31 and the first shielding portion 312 can be formed through a single patterning process during manufacture of the third pattern layer III, thereby reducing processing steps.

The display substrate can further comprise a constant voltage signal line for applying a constant voltage signal. The constant voltage signal has a constant voltage at least during the ON-phase of the driving thin film transistor T9. The third shielding portion 33 is connected to the constant voltage signal line. A source of the driving thin film transistor T9 is connected to the power line 42, and a drain of the driving thin film transistor T9 is configured to be connected to an organic light emitting diode. When the driving thin film transistor T9 is conducted on, the organic light emitting diode is turned on. The voltage applied to the constant voltage signal line is constant at this stage. When the voltage on the data line 41 changes, the voltage on the third shielding portion 33 can keep constant, and the influence of the electric field generated by the data line 41 on the second capacitor plate 21 is better shielded.

In some embodiments of the present disclosure, the constant voltage signal line can comprise at least one of a scan line 22, a reference signal line 51, a power line 42, and a control line for light emitting 23. The scan line 22, the reference signal line 51, the power line 42, and the control line for light emitting 23 are applied with a constant signal voltage when the driving thin film transistor T9 is conducted on, and can all be used as shielding sources. When the voltage on the data line 41 changes, the voltage on the constant voltage signal line does change, such that the voltage on the second capacitor plate will not be caused to change.

In the present embodiment, the third shielding portion 33 is connected to the power line 42. As illustrated in FIG. 7, the third shielding portion 33 can be connected to the power line 42 through a via hole 60. After the third shielding portion 33 is provided, the cross-sectional area of the power line 42 is increased at the via hole 60, and the resistance of the power line 42 is reduced, thereby reducing the voltage drop on the power line 42. In some embodiments of the present disclosure, the third shielding portion 33 can also be connected to at least one of the scan line 22, the reference signal line 51, and the control line for light emitting 23, through a via hole 60.

At least one embodiment of the present disclosure further provides a display device, which comprises any one of the organic light emitting diode display substrates as illustrated in FIG. 2 and FIGS. 4 to 7.

Exemplarily, the display device may be any product or component having a display function, such as a mobile phone, a tablet computer, a television, a notebook computer, a digital photo frame, a navigator, and the like.

Figure 8:
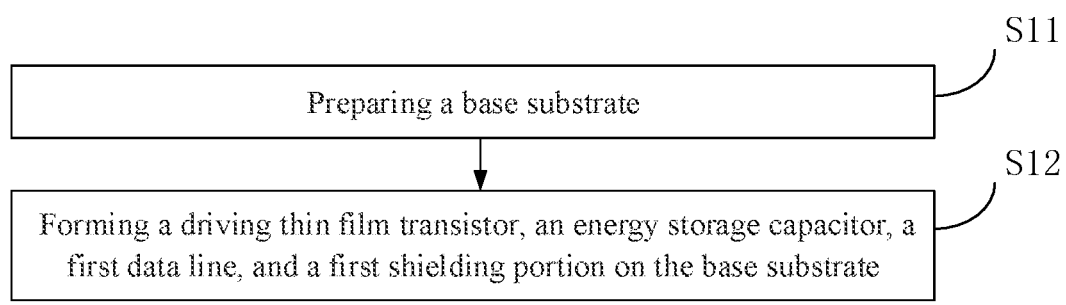
FIG. 8 is a flow chart of a method of manufacturing an organic light emitting diode display substrate according to an embodiment of the present disclosure.

At least one embodiment of the present disclosure further provides a method of manufacturing the organic light emitting diode display substrate as illustrated in FIG. 2 and FIGS. 4 to 7. As illustrated in FIG. 8, the method comprises:

S11: preparing a base substrate; and

S12: forming a driving thin film transistor, an energy storage capacitor, a first data line, and a first shielding portion on the base substrate.

Wherein the second capacitor plate, the first capacitor plate and the first data line are sequentially formed on the base substrate. The first capacitor plate and the second capacitor plate are disposed opposite to each other. The second capacitor plate is electrically connected to a gate of the driving thin film transistor. The first shielding portion is electrically connected to the first capacitor plate and is disposed at least partially between the second capacitor plate and the first data line.

In some embodiments of the present disclosure, the first shielding portion is formed to be electrically connected to the first capacitor plate.

By providing the first shielding portion disposed at least partially between the second capacitor plate and the first data line, the capacitive coupling between the second capacitor plate and the first data line can be shielded, thereby reducing the parasitic capacitance between the second capacitive plate and the first data line, and reducing the effect on the voltage of the second capacitor plate by the change in voltage on the first data line, that is, reducing the voltage change of the gate of the thin film transistor. Thus, the influence on the displayed image caused by changes between different gray levels is effectively improved.

Figure 9:
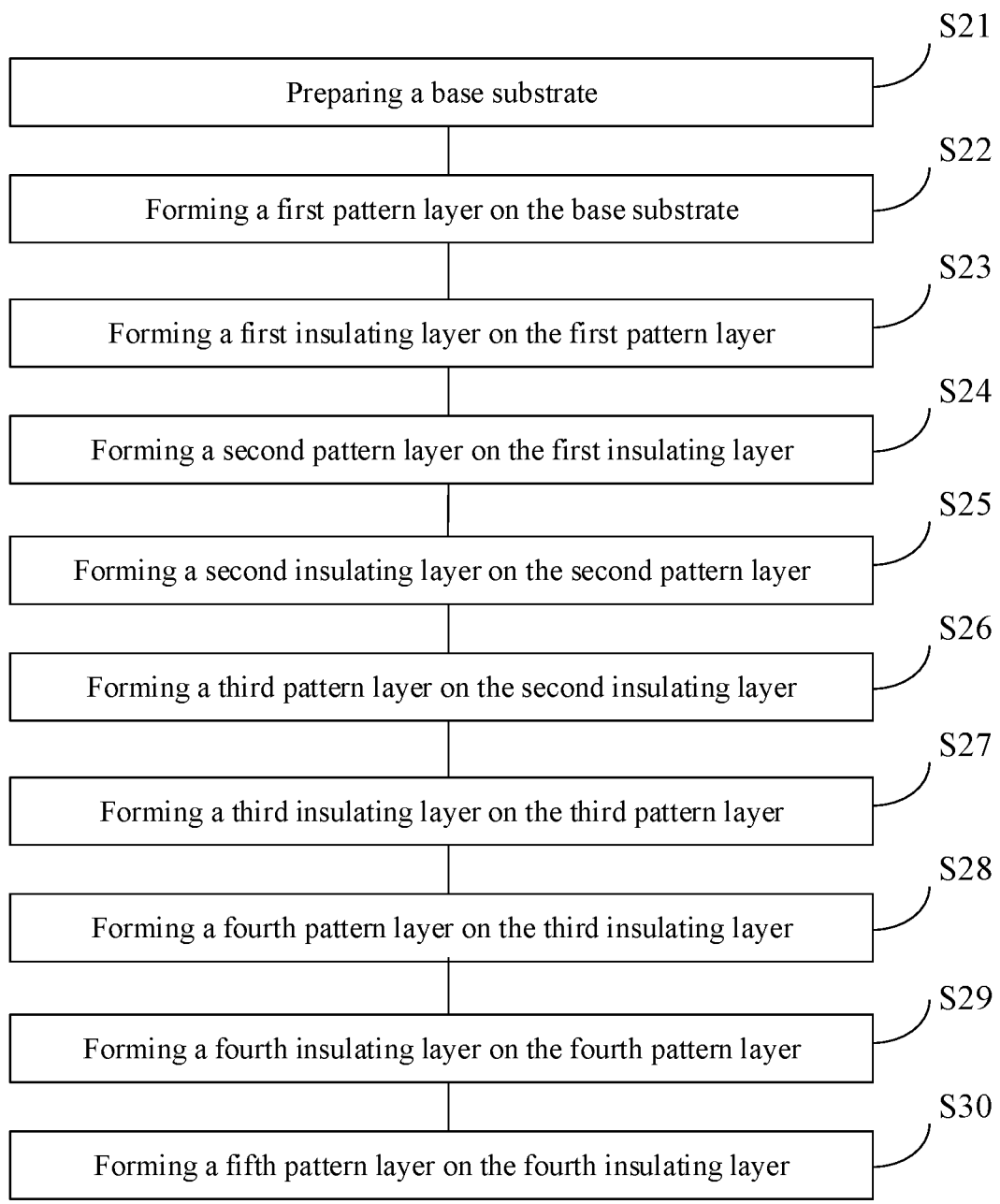
FIG. 9 is a flow chart of a method of manufacturing an organic light emitting diode display substrate according to another embodiment of the present disclosure.

FIG. 9 is a flow chart of a method of manufacturing an organic light emitting diode display substrate according to another embodiment of the present disclosure. The method is used to manufacture the display substrate as illustrated in FIGS. 2 and 4. As illustrated in FIG. 9, the method comprises:

S21: preparing a base substrate; and

S22: forming a first pattern layer on the base substrate.

Figure 10:
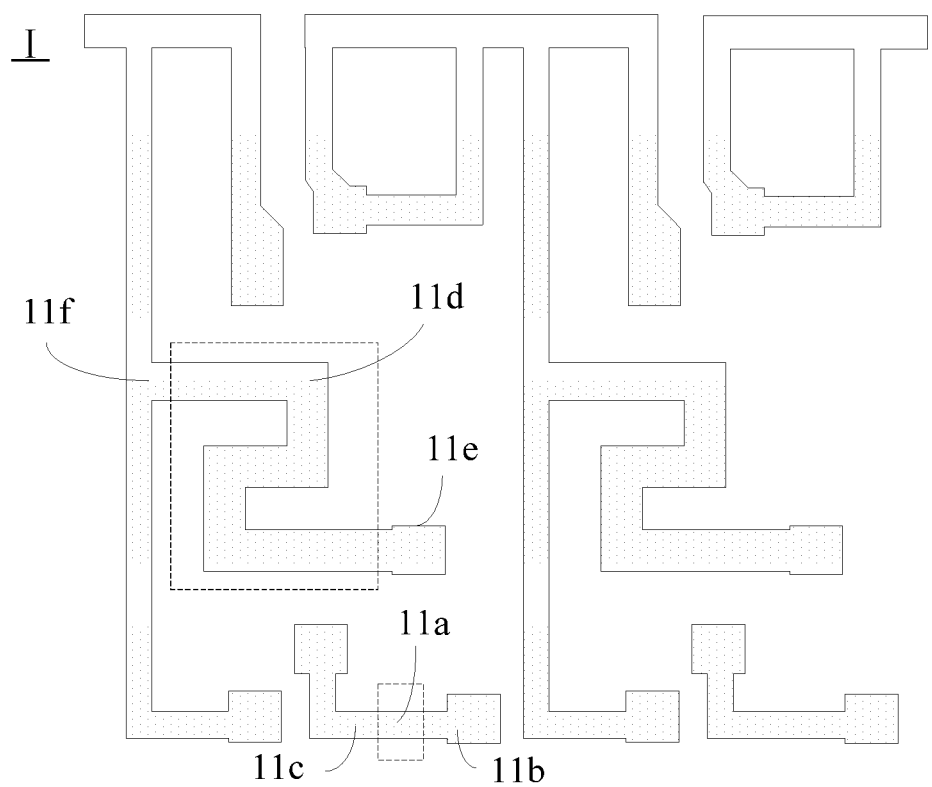
FIGS. 10-14 are schematic diagrams of a process of manufacturing an organic light emitting diode display substrate according to an embodiment of the present disclosure.

The first pattern layer I formed on the base substrate can be as illustrated in FIG. 10. The first pattern layer I can comprise an active layer, a source and a drain. FIG. 10 schematically illustrates an active layer 11a, a source 11b, and a drain 11c of a switching thin film transistor T8 and an active layer 11d, a source 11e, and a drain 11f of a driving thin film transistor T9.

In the step S22, an active material film can be first formed on the base substrate. For example, an active material film can be formed on the base substrate through deposition. The active material thin film may be at least one of InGaZnO, InGaO, ITZO, and AlZnO.

Then, a patterning process is performed on the active material film to obtain the first pattern layer I. After obtaining the first pattern layer I, some portions of the first pattern layer I can be metallized, so that the source and drain are formed in the metalized region, and the active layer is formed in the region that is not metalized.

When performing the metallization, the area of the active material film where the metallization process is not required can be covered with an etching barrier layer (for example, the two dashed box areas in FIG. 10 are covered with the etching barrier layer), and the etching barrier layer is removed after the metallization is completed.

In FIG. 10, only two regions covered with the etching barrier layer are illustrated by way of example. After the metallization is completed and the etching barrier layer is removed, the formed active layer 11d of the driving thin film transistor T9 is illustrated in the larger dotted block in FIG. 10, and the formed active layer 11a of the switching thin film transistor T8 is illustrated in the smaller dotted block in FIG. 10. During manufacturing, areas where the active layers of other thin film transistors are formed can also be covered with the etching barrier layer.

The metallization is performed in a reducing atmosphere at 100° C. to 300° C. for 30 min to 120 min. The reducing atmosphere comprises hydrogen or a plasma containing hydrogen. Through a reduction reaction in a reducing atmosphere at 100° C.~300° C. for 30 min~120 min, it can be ensured to the greatest extent that the area of the active material film that is not covered by the etching barrier layer can be fully and effectively reduced to metal oxide conductor. If the temperature is too low, the reduction effect of the reduction reaction will be affected, and the reaction time will be prolonged, which will reduce the production efficiency; if the temperature is too high, it is easy to make the raw material film covered by the etching barrier layer that is not required to be subjected to metallization subjected to chemical action, which in turn affects the performance of the structures. Similarly, if the time is too short, the reduction reaction will not proceed sufficiently. If the time is too long, the reaction time will be extended and production efficiency will be reduced.

S23: forming a first insulating layer on the first pattern layer.

Exemplarily, the first insulating layer may be formed by a vapor deposition method. The first insulating layer may be made of an insulating material such as silicon nitride or silicon oxide.

S24: forming a second pattern layer on the first insulating layer.

Figure 11:
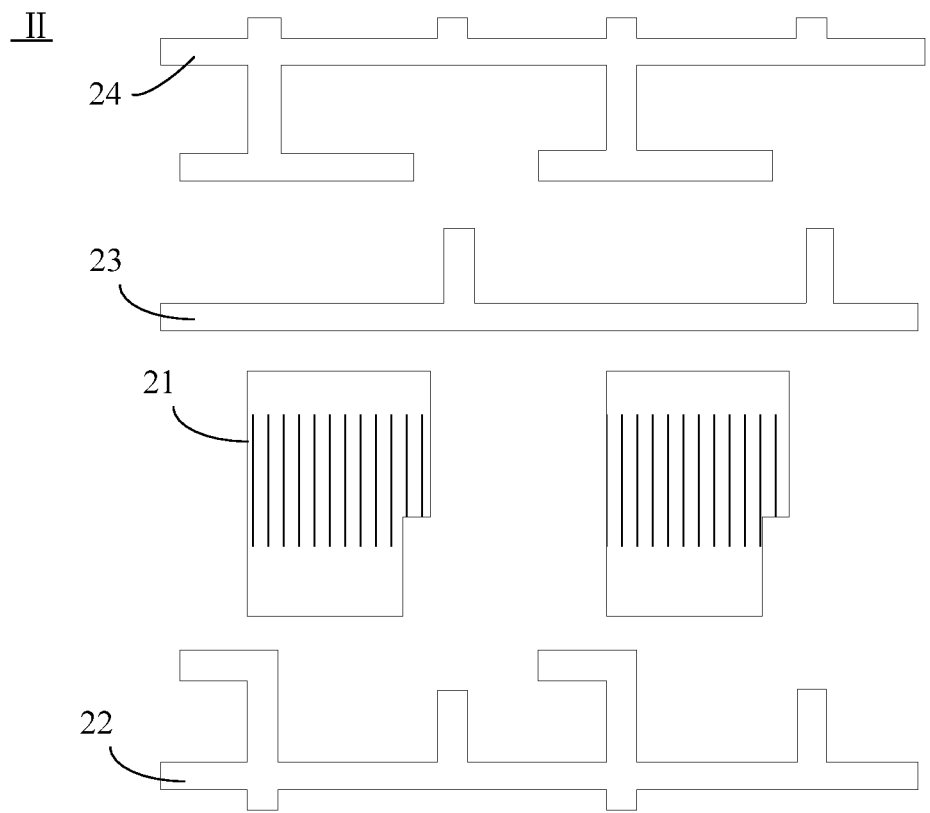

The second pattern layer II formed on the first insulating layer is as illustrated in FIG. 11. The second pattern layer II can comprise a first pattern, and the first pattern may comprise a second capacitor plate 21.

Exemplarily, a first material layer can be formed on the base substrate on which the first insulating layer is formed, and then the first material layer is processed through a patterning process to obtain the first pattern.

The first material layer may be a metal thin film, and the first material layer may be formed by sputtering or the like.

Optionally, the first pattern layer can comprise a scan line 22, a control line for light emitting 23, and a reset signal line 24. Disposing multiple structures of the display substrate in the same layer is beneficial to reduce the thickness of the display substrate, and the second capacitor plate 21, the scan line 22, the control line for light emitting 23, and the reset signal line 24 can be formed through a single patterning process, thereby reducing the process steps.

S25: forming a second insulating layer on the second pattern layer.

The second insulating layer is formed in a manner same as that of the first insulating layer.

S26: forming a third pattern layer on the second insulating layer.

The third pattern layer III formed on the second insulating layer comprises a second patter. For example, as illustrated in FIG. 12, the second pattern comprises a first capacitor plate 31 and a first shielding portion 312, or, as illustrated in FIG. 13, the second pattern comprises a first capacitor plate 31 and a first shielding portion 312 and the second shielding portion 313.

Exemplarily, a second material layer can be formed on the base substrate on which the second insulating layer is formed, and then the second material layer is processed through a patterning process to obtain the second pattern.

The second material layer may be a metal thin film, and the second material layer may be formed by sputtering or the like.

Figure 12:
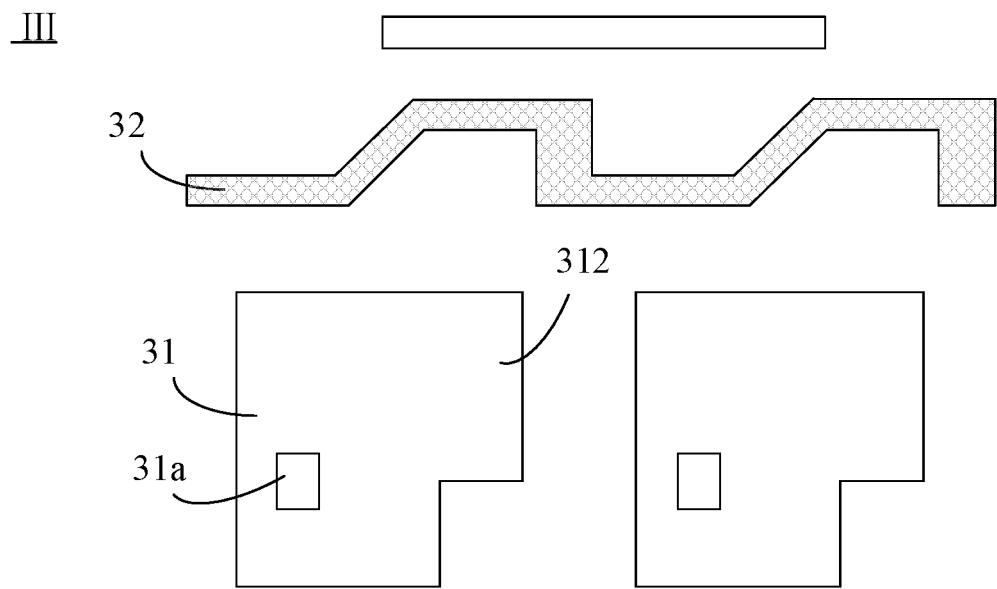
Figure 13:
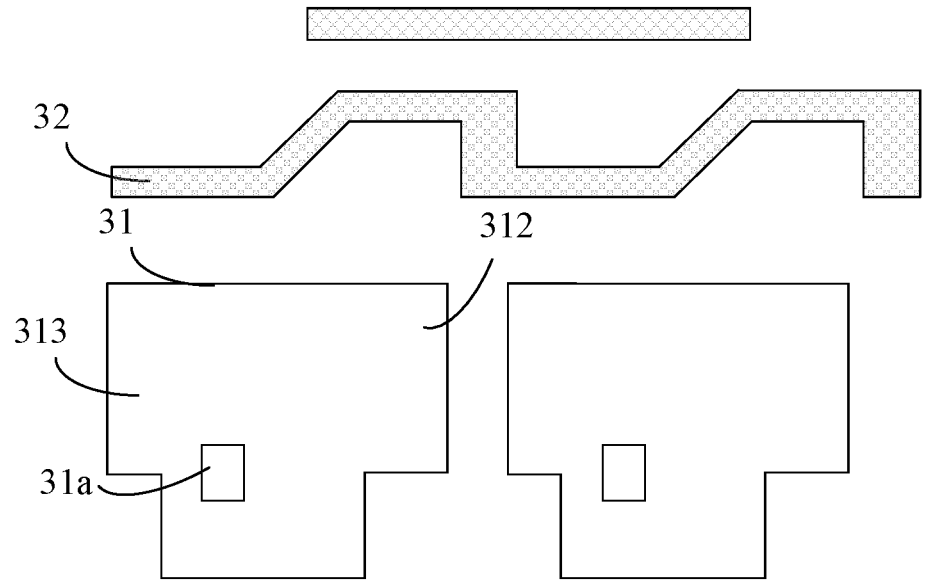

In the patterning process for forming the third pattern layer III, a first capacitor plate 31 and a first shielding portion 312 can be formed in the display substrate as illustrated in FIG. 12. Alternatively, a first capacitor plate 31 and a first shielding portion 312 and the second shielding portion 313 in the display substrate as illustrated in FIG. 13 can be formed through a different patterning process.

S27: forming a third insulating layer on the third pattern layer.

The third insulating layer is formed in a manner same as that of the first insulating layer.

S28: forming a fourth pattern layer on the third insulating layer.

Figure 14:
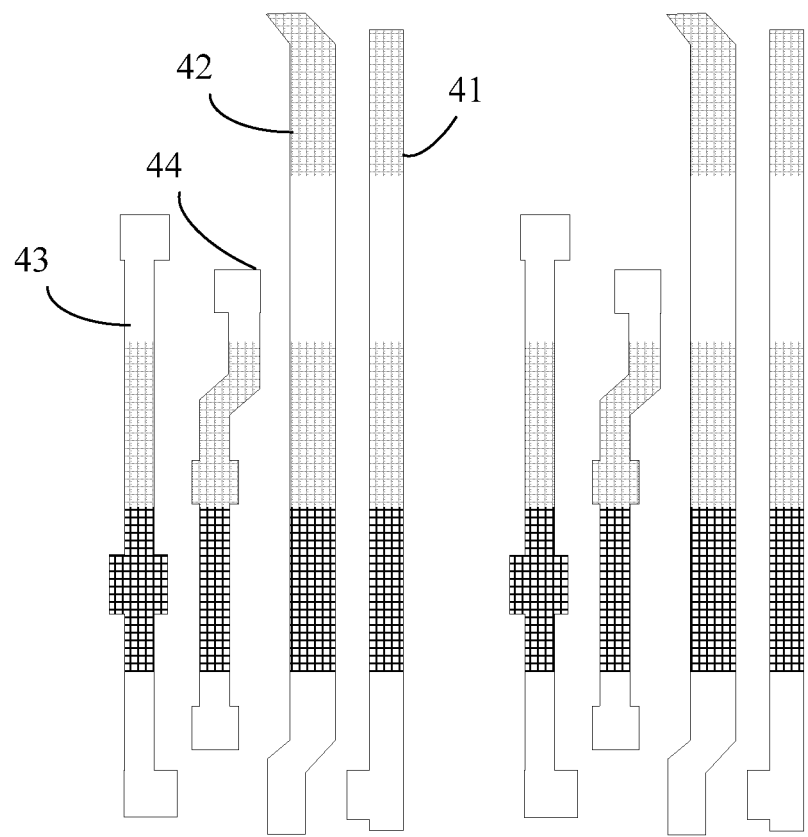

The fourth pattern layer IV formed on the third insulating layer is as illustrated in FIG. 14. The fourth pattern layer IV comprises a third pattern, and the third pattern may comprise a first data line 41.

Exemplarily, a third material layer can be formed on the base substrate on which the third patter layer III is formed, and then the third material layer is processed through a patterning process to obtain the third pattern.

The third material layer may be a metal thin film, and the third material layer may be formed by sputtering or the like.

In some embodiments of the present disclosure, the third pattern can further comprise a power line 42, a first connecting line 43, and a second connecting line 44. Disposing multiple structures of the display substrate in the same layer is beneficial to reduce the thickness of the display substrate, and the first data line 41, the power line 42, the first connecting line 43 and the second connecting line 44 can be formed through a single patterning process, thereby reducing the process steps.

S29: forming a fourth insulating layer on the fourth pattern layer.

The fourth insulating layer is formed in a manner same as that of the first insulating layer.

S30: forming a fifth pattern layer on the fourth insulating layer.

The fifth pattern layer V can comprise a reference signal line 51. The fifth pattern layer is formed in a manner same as that of the fourth pattern layer. The structure of the display substrate after the fifth pattern layer V is formed can be referred to FIG. 2 or FIG. 3.

Regions to be connected in different pattern layers can be connected through via holes. For details, please refer to the foregoing embodiments. Therefore, in steps S23, S25, S27, and S29, via holes can further be formed in the formed insulating layers.

Figure 15:
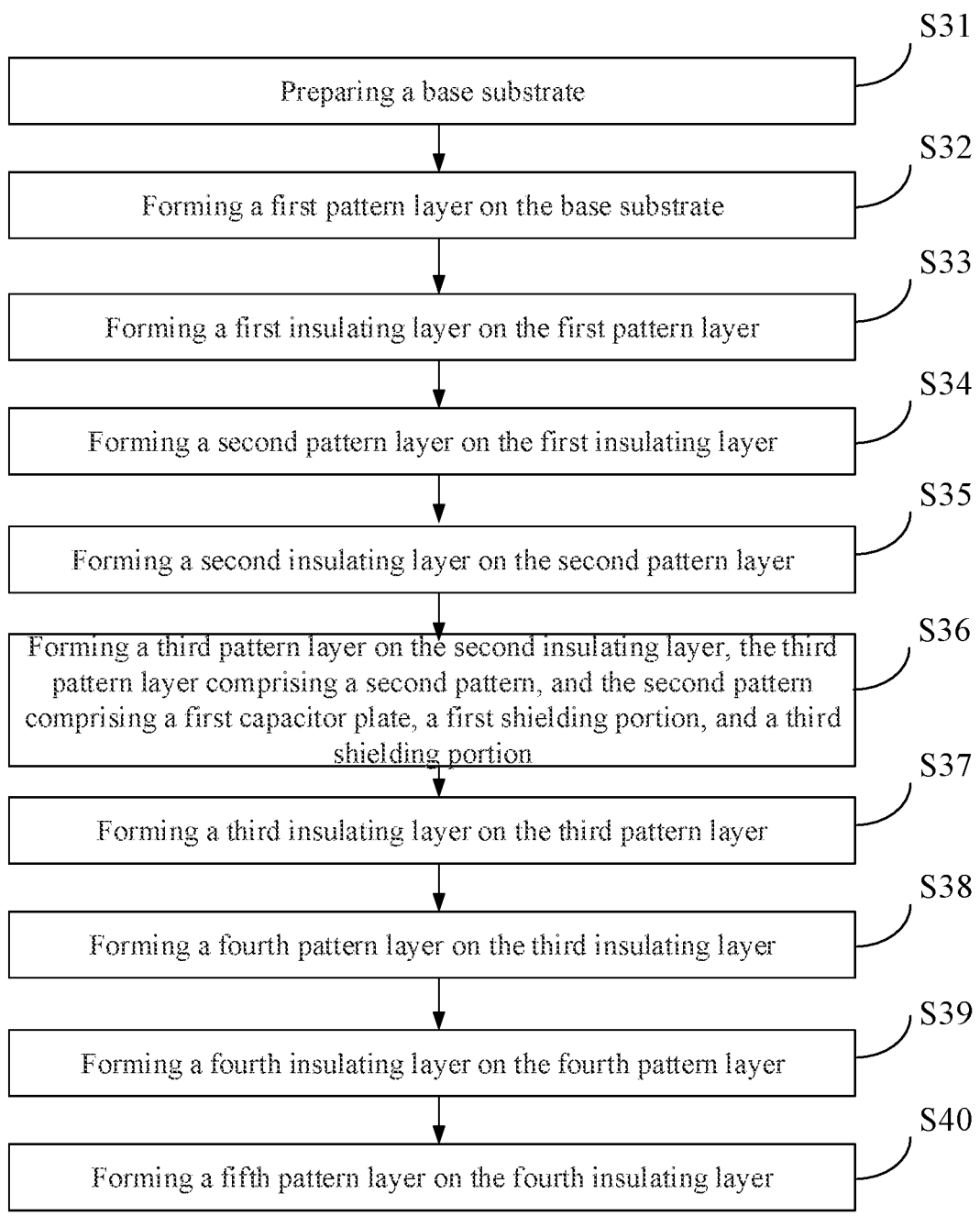
FIG. 15 is a flow chart of a method of manufacturing an organic light emitting diode display substrate according to another embodiment of the present disclosure.

FIG. 15 is a flow chart of a method of manufacturing an organic light emitting diode display substrate according to another embodiment of the present disclosure. The method is used to manufacture the display substrate as illustrated in FIG. 7. As illustrated in FIG. 15, the method comprises:

S31: preparing a base substrate; and

S32: forming a first pattern layer on the base substrate.

Step S32 is the same as step S22.

S33: forming a first insulating layer on the first pattern layer.

Step S33 is the same as step S23.

S34: forming a second pattern layer on the first insulating layer.

Step S34 is the same as step S24.

S35: forming a second insulating layer on the second pattern layer.

Step S35 is the same as step S25.

S36: forming a third pattern layer on the second insulating layer.

Figure 16:
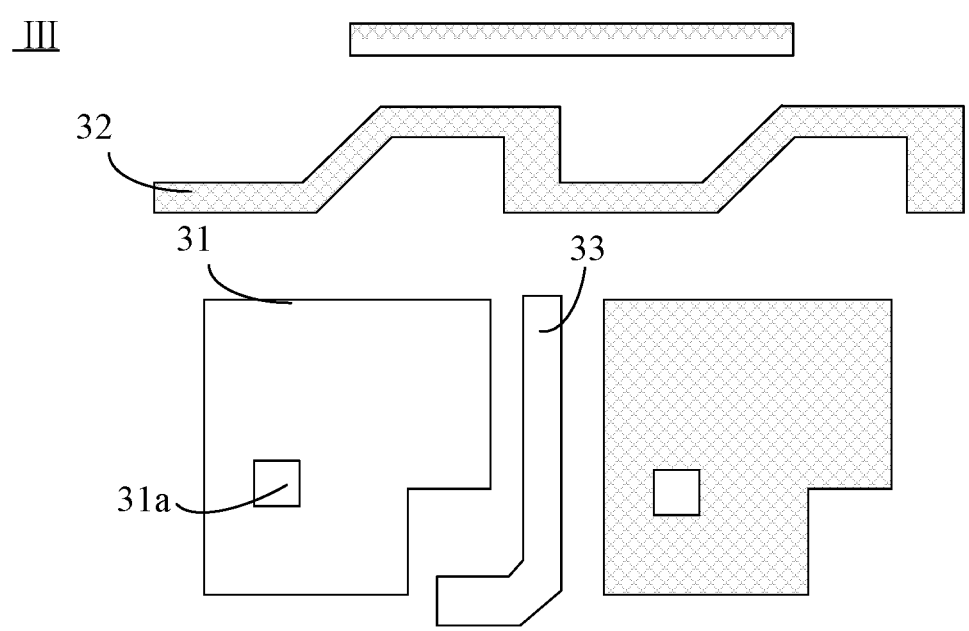
FIG. 16 is a schematic diagram of a process of manufacturing an organic light emitting diode display substrate according to an embodiment of the present disclosure.

The third pattern layer III formed on the second insulating layer is as illustrated in FIG. 16. The third pattern layer III has a second pattern, and the second pattern comprises a first capacitor plate 31, a first shielding portion 312 and a third shielding portion 33.

The difference between step S36 and step S26 is that the formed second pattern further comprises the third shielding portion 33.

S37: forming a third insulating layer on the third pattern layer.

Step S37 is the same as step S27.

S38: forming a fourth pattern layer on the third insulating layer.

Step S38 is the same as step S28.

S39: forming a fourth insulating layer on the fourth pattern layer.

Step S39 is the same as step S29.

S40: forming a fifth pattern layer on the fourth insulating layer.

Step S40 is the same as step S30.

The structure of the display substrate after forming the fifth pattern layer can be referred to FIG. 7.

Figure 17:
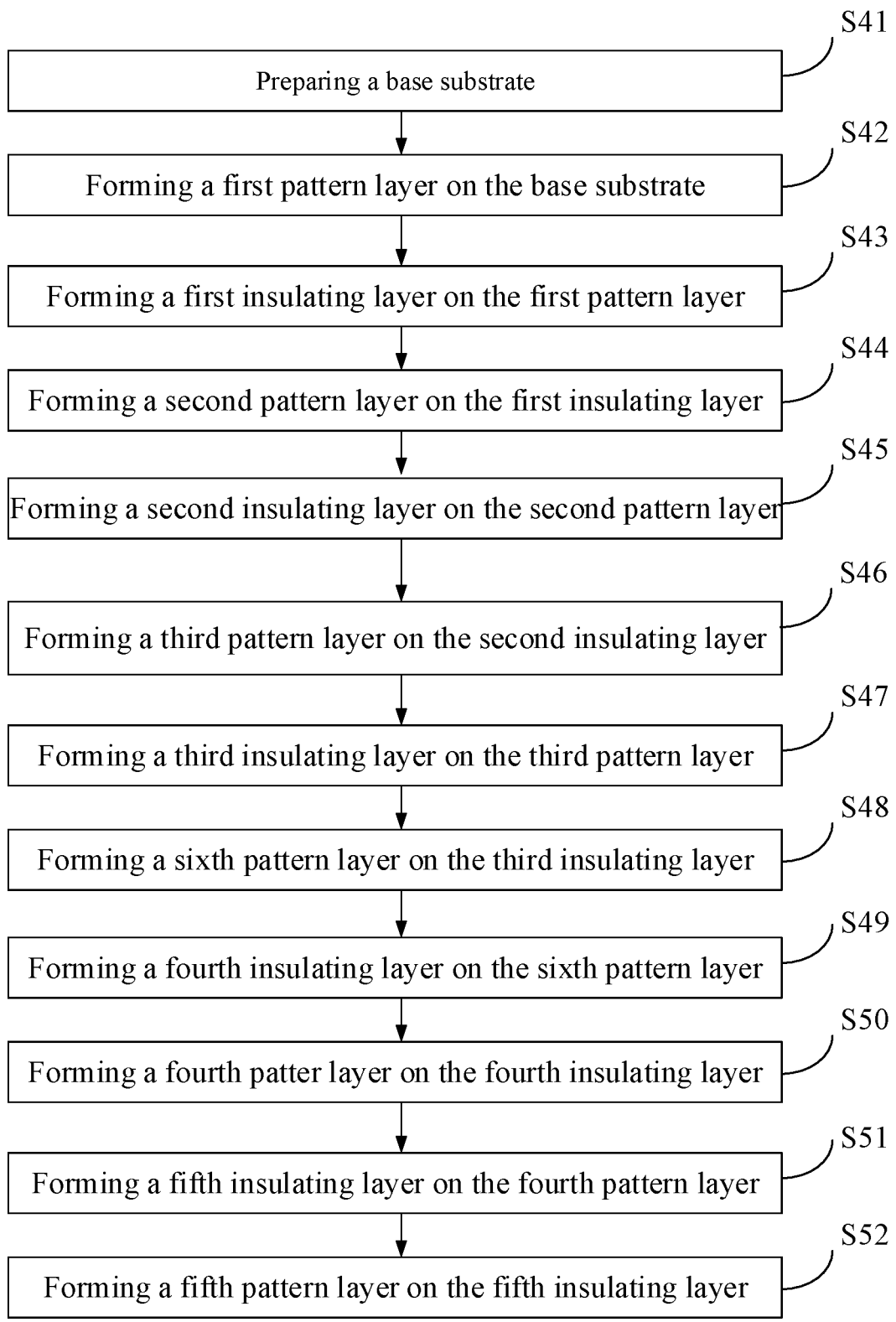
FIG. 17 is a flow chart of a method of manufacturing an organic light emitting diode display substrate according to another embodiment of the present disclosure.

FIG. 17 is a flow chart of a method of manufacturing an organic light emitting diode display substrate according to another embodiment of the present disclosure. The method is used to manufacture the display substrate as illustrated in FIG. 6. As illustrated in FIG. 17, the method comprises:

S41: preparing a base substrate; and

S42: forming a first pattern layer on the base substrate.

Step S42 is the same as step S22.

S43: forming a first insulating layer on the first pattern layer.

Step S43 is the same as step S23.

S44: forming a second pattern layer on the first insulating layer.

Step S44 is the same as step S24.

S45: forming a second insulating layer on the second pattern layer.

Step S45 is the same as step S25.

S46: forming a third pattern layer on the second insulating layer.

Step S46 is the same as step S26.

S47: forming a third insulating layer on the third pattern layer.

Step S47 is the same as step S27.

S48: forming a sixth pattern layer on the third insulating layer.

As illustrated in FIG. 16, the sixth pattern layer VI comprises a third pattern, and the third pattern may comprise a third shielding portion 33.

Exemplarily, a third material layer can be formed on the base substrate on which the third patter layer III is formed, and then the third material layer is processed through a patterning process to obtain the third pattern.

The third material layer may be a metal thin film, and the third material layer may be formed by sputtering or the like, and then, the third material layer is patterned through a patterning process to form the third shielding portion 33.

S49: forming a fourth insulating layer on the sixth pattern layer.

Step S49 is the same as step S47.

S50: forming a fourth pattern layer on the fourth insulating layer.

The fourth pattern layer comprises a fourth pattern, and the fourth pattern may comprise a data line 41.

Exemplarily, a fourth material layer can be formed on the base substrate on which the third patter layer is formed, and then the fourth material layer is processed through a patterning process to obtain the fourth pattern.

The fourth material layer may be a metal thin film, and the fourth material layer may be formed by sputtering or the like.

In some embodiments of the present disclosure, the fourth pattern can further comprise a power line 42, a first connecting line 43, and a second connecting line 44. Disposing multiple structures of the display substrate in the same layer is beneficial to reduce the thickness of the display substrate, and the data line 41, the power line 42, the first connecting line 43 and the second connecting line 44 can be formed through a single patterning process, thereby reducing the process steps.

S51: forming a fifth insulating layer on the fourth pattern layer.

Step S51 is the same as step S29.

S52: forming a fifth pattern layer on the fifth insulating layer.

Step S52 is the same as step S30.

Persons of ordinary skill in the art can understand that all or part of the steps described in the above embodiments can be completed through hardware, or through relevant hardware instructed by applications stored in a non-transitory computer readable storage medium, such as a read-only memory, a disk or a CD, etc.

The foregoing descriptions are merely exemplary embodiments of the present disclosure, and are not intended to limit the present disclosure. Within the spirit and principles of the disclosure, any modifications, equivalent substitutions, improvements, etc., are within the protection scope of the present disclosure.

What is claimed is:

1. An organic light emitting diode display substrate, comprising: a base substrate, a first data line, a driving thin film transistor, and an energy storage capacitor, wherein the first data line, the driving thin film transistor, and the energy storage capacitor are disposed on the base substrate;
the energy storage capacitor comprising a first capacitor plate and a second capacitor plate disposed opposite to each other, the second capacitor plate disposed on the base substrate, the first capacitor plate disposed on a side of the second capacitor plate away from the base substrate, the first data line disposed on a side of the first capacitor plate away from the base substrate, and the second capacitor plate being electrically connected to a gate of the driving thin film transistor;
wherein the organic light emitting diode display substrate further comprises a shielding portion, the shielding portion is between the second capacitor plate and the first data line in a direction perpendicular to the base substrate, and an orthographic projection of the shielding portion on the base substrate at least partially overlaps an orthographic projection of the first data line on the base substrate.

2. The organic light emitting diode display substrate according to claim 1, wherein the shielding portion is electrically connected to a power line.

3. The organic light emitting diode display substrate according to claim 1, wherein the shielding portion is disposed in a same layer as the first capacitor plate, and a space is between the shielding portion and the first capacitor plate.

4. The organic light emitting diode display substrate according to claim 1, wherein the third shielding portion extends in a direction parallel to a direction in which the first data line extends, and is disposed between adjacent first capacitor plates.

5. The organic light emitting diode display substrate according to claim 1, further comprising a constant voltage signal line configured to apply a constant voltage signal, wherein a voltage of the constant voltage signal is constant at least during an ON-phase of the driving thin film transistor, and the shielding portion is connected to the constant voltage signal line.

6. The organic light emitting diode display substrate according to claim 5, wherein the constant voltage signal line comprises at least one of a scanning line, a reference signal line, a power line, or a control line for light emitting.

7. The organic light emitting diode display substrate according to claim 6, wherein the power line and the first data line are disposed in a same layer.

8. The organic light emitting diode display substrate according to claim 1, further comprising a voltage equalizing line and a plurality of power lines, wherein at least a portion of the plurality of power lines is connected to the voltage equalizing line.

9. The organic light emitting diode display substrate according to claim 8, wherein the voltage equalizing line is disposed in a same layer as the first capacitor plate.

10. The organic light emitting diode display substrate according to claim 8, wherein the voltage equalizing line extends in a first direction, the power lines extend in a second direction, and the first direction intersects with the second direction.

11. The organic light emitting diode display substrate according to claim 10, wherein an orthographic projection of the voltage equalizing line on the base substrate at least partially overlaps an orthographic projection of the first data line on the base substrate, and a length of an overlapping portion of the orthographic projection of the voltage equalizing line on the base substrate in the second direction is greater than a width of the first data line.

12. The organic light emitting diode display substrate according to claim 1, wherein a gate of the driving thin film transistor is connected to the second capacitor plate, a first electrode of the driving thin film transistor is connected to a power line, and a second electrode of the driving thin film transistor is connected to an anode of an organic light emitting diode; and the organic light emitting diode display substrate further comprises a first thin film transistor and a second thin film transistor, wherein a gate of the first thin film transistor is connected to a scan line, a first electrode of the first thin film transistor is connected to the second electrode of the driving thin film transistor, and a second electrode of the first thin film transistor is connected to the gate of the driving thin film transistor; and a gate of the second thin film transistor is connected to the scan line, a first electrode of the second thin film transistor is connected to the first data line, and a second electrode of the second thin film transistor is connected to the first capacitor plate.

13. The organic light emitting diode display substrate according to claim 12, further comprising a third thin film transistor, wherein a gate of the third thin film transistor is connected to a reset signal line, a first electrode of the third thin film transistor is connected to a reference signal line, and a second electrode of the third thin film transistor is connected to the first capacitor plate.

14. The organic light emitting diode display substrate according to claim 13, wherein the reference signal line extends in a first direction, and the reference signal line is disposed on a side of the first capacitor plate away from the base substrate in a direction perpendicular to the base substrate.

15. The organic light emitting diode display substrate according to claim 14, wherein the reference signal line is connected to the first electrode of the third thin film transistor through a via hole.

16. An organic light emitting diode display device, comprising an organic light emitting diode display substrate, wherein the organic light emitting diode display substrate comprises: a base substrate, a first data line, a driving thin film transistor, and an energy storage capacitor, wherein the first data line, the driving thin film transistor, and the energy storage capacitor are disposed on the base substrate;

the energy storage capacitor comprising a first capacitor plate and a second capacitor plate disposed opposite to each other, the second capacitor plate disposed on the base substrate, the first capacitor plate disposed on a side of the second capacitor plate away from the base substrate, the first data line disposed on a side of the first capacitor plate away from the base substrate, and the second capacitor plate being electrically connected to a gate of the driving thin film transistor;

wherein the organic light emitting diode display substrate further comprises a shielding portion, the shielding portion is between the second capacitor plate and the first data line in a direction perpendicular to the base substrate, and an orthographic projection of the shielding portion on the base substrate at least partially overlaps-overlap an orthographic projection of the first data line on the base substrate.

17. The organic light emitting diode display device according to claim 16, wherein the shielding portion is electrically connected to a power line.

18. The organic light emitting diode display device according to claim 16, wherein the shielding portion is disposed in a same layer as the first capacitor plate, and a space is between the shielding portion and the first capacitor plate.

19. The organic light emitting diode display device according to claim 16, wherein the third shielding portion extends in a direction parallel to a direction in which the first data line extends, and is disposed between adjacent first capacitor plates.

20. A method of manufacturing an organic light emitting diode display substrate, comprising:

preparing a base substrate; and forming a driving thin film transistor, an energy storage capacitor, and a first data line on the base substrate, the energy storage capacitor comprising a first capacitor plate and a second capacitor plate;

wherein, the second capacitor plate, the first capacitor plate and the first data line are sequentially disposed sequentially in a direction away from the base substrate, the first capacitor plate and the second capacitor plate are disposed opposite to each other, and the second capacitor plate is electrically connected to a gate of the driving thin film transistor; and wherein the method further comprises forming a shielding portion, the shielding portion is between the second capacitor plate and the first data line in a direction perpendicular to the base substrate, and an orthographic projection of the shielding portion on the base substrate at least partially overlaps an orthographic projection of the first data line on the base substrate.

* * * * *